(12) United States Patent
Yamazaki

(10) Patent No.: US 9,577,410 B2
(45) Date of Patent: Feb. 21, 2017

(54) OPTICAL FUNCTIONAL INTEGRATED UNIT AND METHOD FOR MANUFACTURING THEREOF

(71) Applicant: NEC Corporation, Tokyo (JP)

(72) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/764,607

(22) PCT Filed: Oct. 25, 2013

(86) PCT No.: PCT/JP2013/006336
§ 371 (c)(1),
(2) Date: Jul. 30, 2015

(87) PCT Pub. No.: WO2014/118836
PCT Pub. Date: Aug. 7, 2014

(65) Prior Publication Data
US 2015/0372453 A1    Dec. 24, 2015

(30) Foreign Application Priority Data

Feb. 1, 2013   (JP) .................................. 2013-018969

(51) Int. Cl.
*H01S 5/14* (2006.01)
*H01S 5/022* (2006.01)
(Continued)

(52) U.S. Cl.
CPC ........... *H01S 5/142* (2013.01); *G02B 6/12004* (2013.01); *G02B 6/423* (2013.01); *G02F 2/00* (2013.01);
(Continued)

(58) Field of Classification Search
CPC .. H01S 5/142; H01S 5/02236; H01S 5/02252; G02B 6/12004; G02B 2006/12092; G02B 2006/12085; G02B 2006/12104; G02B 2006/12116; G02B 2006/12121; G02B 2006/12159; G02B 2006/12061
See application file for complete search history.

(56) References Cited

U.S. PATENT DOCUMENTS 8,005,122 B2 * 8/2011 Shimizu ................ H01S 5/0602
372/18
8,837,869 B2 * 9/2014 Akutsu ................. G02B 6/2766
359/344

(Continued)

FOREIGN PATENT DOCUMENTS

JP   2000-249876   9/2000
JP   2004-117706   4/2004
(Continued)

OTHER PUBLICATIONS

International Search Report and Written Opinion mailed Jan. 21, 2014 in corresponding PCT International Application.

*Primary Examiner* — Eric Bolda
(74) *Attorney, Agent, or Firm* — Finnegan, Henderson, Farabow, Garrett & Dunner, L.L.P.

(57) ABSTRACT

It is provided that an optical functional integrated unit and a method for manufacturing thereof in which a positive optical device and a passive optical device including a silicon waveguide can be readily integrated. An optical functional integrated unit includes a semiconductor optical amplifier, a photonics device, a mounting board, pedestals and. The pedestals and are provided on the mounting board. The semiconductor optical amplifier is mounted on the pedestal and outputs a light from an active layer. The photonics device is mounted on the pedestal. The photonics device includes silicon waveguide to which the light output from the semiconductor optical amplifier is guided.

16 Claims, 10 Drawing Sheets

(51) Int. Cl.
*H01S 5/028* (2006.01)
*G02B 6/42* (2006.01)
*G02B 6/12* (2006.01)
*H01S 5/06* (2006.01)
*G02F 2/00* (2006.01)

(52) U.S. Cl.
CPC ......... *H01S 5/0287* (2013.01); *H01S 5/02228* (2013.01); *H01S 5/02252* (2013.01); *H01S 5/02256* (2013.01); *H01S 5/0612* (2013.01); *H01S 5/02272* (2013.01)

(56) References Cited

U.S. PATENT DOCUMENTS

| | | | | |
|---|---|---|---|---|
| 8,897,606 | B2* | 11/2014 | Asghari | G02F 1/2257 385/2 |
| 2003/0072076 | A1* | 4/2003 | Yoon | H01S 5/02284 359/344 |
| 2004/0057653 | A1 | 3/2004 | Fukuda et al. | |
| 2008/0240646 | A1* | 10/2008 | Yamazaki | G02B 6/12007 385/14 |
| 2009/0010592 | A1* | 1/2009 | Yamazaki | G02B 6/30 385/14 |
| 2009/0122817 | A1* | 5/2009 | Sato | G02B 6/12007 372/20 |
| 2011/0116738 | A1* | 5/2011 | Watanabe | G02B 6/423 385/14 |
| 2011/0142391 | A1* | 6/2011 | Asghari | G02F 1/2257 385/2 |
| 2011/0194572 | A1* | 8/2011 | Yamazaki | G02B 6/125 372/6 |
| 2012/0002694 | A1* | 1/2012 | Bowers | H01S 5/14 372/45.01 |
| 2012/0002931 | A1 | 1/2012 | Watanabe | |
| 2012/0320939 | A1* | 12/2012 | Baets | B82Y 20/00 372/45.01 |
| 2013/0016423 | A1* | 1/2013 | Zheng | H01S 5/142 359/344 |
| 2013/0016744 | A1* | 1/2013 | Li | B82Y 20/00 372/20 |

FOREIGN PATENT DOCUMENTS

| | | |
|---|---|---|
| JP | 2004-354947 | 12/2004 |
| JP | 2007-309987 | 11/2007 |
| JP | 2009-16594 | 1/2009 |
| JP | 2012-173423 | 9/2012 |
| JP | 2012-256667 | 12/2012 |
| WO | WO 2010/106995 A1 | 9/2010 |

* cited by examiner

US 9,577,410 B2

OPTICAL FUNCTIONAL INTEGRATED UNIT AND METHOD FOR MANUFACTURING THEREOF

CROSS-REFERENCE TO RELATED PATENT APPLICATIONS

This application is a National Stage Entry of International Application No. PCT/JP2013/006336, filed Oct. 25, 2013, which claims priority from Japanese Patent Application No. 2013-018969, filed Feb. 1, 2013. The entire contents of the above-referenced applications are expressly incorporated herein by reference.

TECHNICAL FIELD

The present invention relates to an optical functional integrated unit and a method for manufacturing thereof.

BACKGROUND ART

As a broadband era has been developed, introduction of a WDM (Wavelength Division Multiplexing) transmission system, which can communicate using plural optical wavelengths, has proceeded. Recently, application of a DWDM (Dense Wavelength Division Multiplexing) device, which can achieve a further high-rate transmission by multiplexing several tens of the optical wavelengths, has spread.

Accordingly, in the WDM transmission system, light sources corresponding to each of the wavelengths are required, and number of the required light source has been dramatically increasing according to high-multiplexing. Further, recently, a research for commercializing a ROADAM (Reconfigurable Optical Add/Drop Multiplexers) in which an arbitrary wavelength is added/dropped at each node has proceeded. Transmission capacity by wavelength multiplexing can be expanded and, further, light path switching can be achieved by changing the wavelength in the case of introducing the ROADM system. Thus, degree of freedom of an optical network is extremely increased.

A distributed feedback laser diode (Hereinafter, referred to as a DFB-LD) oscillating in a single axial mode has been used as the light source for the WDM transmission system from the view point of usability and high-reliability thereof in the past. A diffractive grating of about 30 nm depth is formed on whole area of a resonator in the DFB-LD, and it is possible to obtain a stable single-axial-mode oscillation the wavelength of which corresponds to a product of a period of the diffractive grating and twice of an equivalent refractive index.

However, the DFB-LD cannot tune in an extensive oscillating wavelength range while the DFB-LD can obtain the stable single-axial-mode oscillation. Accordingly, the DFB-LDs that are different in only the wavelength for each of ITU (International Telecommunication Union) grids to configure the WDM transmission system using the DFB-LD. That is, the different DFB-LD needs to be used for each wavelength, and thus, shelf control cost increases and excessive inventory for corresponding malfunction needs to be kept. Further, in the ROADM in which the light path is changed by the wavelength, a wavelength-tunable width is limited to about 3 nm that is a wavelength range changeable by temperature change when a general DFB-LD is used. As a result, it is difficult to configure the optical network utilizing an advantage of the ROADM that positively uses wavelength resource.

A research for the tunable laser has been done for overcoming such problem included in the existent DFB-LD and achieving the single axis-mode oscillation in a wide wavelength range. The tunable laser is generally categorized into two types including a type in which a wavelength-tunable structure and a laser resonator are introduced into the same device, and a type in which the wavelength-tunable structure is introduced outside the device.

In the former tunable laser in which the wavelength-tunable structure and the laser resonator are introduced into the same device, a light-emitting area and a distributed-reflection area are separately provided in the same device. For example, a DBR-LD (Distributed Bragg Reflector Laser Diode) is known as this type of the tunable laser. Further, sampled-grating-DBR-LD and a SSG (Super Structure Grating)-DBR-LD in which light-emitting area is sandwiched with diffractive gratings the diffractive grating periods of which are periodically changed in the DBR-LD are known. Although a wavelength-tunable range of the DBR-LD is limited to about 10 nm at a maximum, in the sampled-grating-DBR-LD, a wavelength-tunable operation over 100 nm and a semi-continuous wavelength-tunable operation at 40 nm are achieved by adeptly using the vernier effect that is characteristics in the present structure.

A system in which a diffractive grating is provided outside a device and a wavelength-tunable operation is done by precisely adjusting an angle and distance of the diffractive grating is proposed as the latter tunable laser in which the wavelength-tunable structure is introduced outside the device.

Further, as another example, a structure in which an optical resonator consists of a PLC (Planar Lightwave Circuit) on which an external resonator is formed and a LD (Laser Diode) or SOA (Semiconductor Optical Amplifier) is directly mounted on the PLC is proposed (e.g., PTL1). In the tunable laser, a step is provided for mounting the SOA, for example, on the PLC. The SOA is set in this step part. Thus, an active layer of the SOA and a waveguide of the PLC are in a position relationship capable of being aligned.

CITATION LIST

Patent Literature

PTL1: Japanese unexamined patent application publication No. 2007-309987

SUMMARY OF INVENTION

Technical Problem

However, the inventor has found a problem described below in the above-mentioned tunable laser. When a photonics device including a silicon waveguide is used, a non-reflective coating with respect to air needs to be applied to an end face in order to cause an end face part of the silicon waveguide to be a non-reflective end. However, as described above, a position of an end part of the waveguide recedes from the end face of the photonics device when the step is provided in the photonics device.

Therefore, when the coating is tried to be formed from a side of the end face of the photonics device, for example, by the vacuum vapor deposition method, vapor of coating material is disturbed and it is impossible to provide the even and durable coating on the end part of the silicon waveguide. Thus, in the structure in which the step is formed, the tunable laser cannot be configured by using the photonics device including the silicon waveguide.

The present invention has been made in view of the above-mentioned circumstances, and an object of the present invention is to provide an optical functional integrated unit and a method for manufacturing thereof in which a positive optical device and a passive optical device including a silicon waveguide can be readily integrated.

Solution to Problem

An aspect of the present invention is an optical functional integrated unit including; a mounting board; a first pedestal and a second pedestal that are provided on the mounting board; a positive optical device that is mounted on the first pedestal and outputs a light from an active layer; and a passive optical device that is mounted on the second pedestal. The passive optical device includes a silicon waveguide through which the light output from the positive optical device is guided.

An aspect of the present invention is a method for manufacturing an optical functional integrated unit including: forming a first pedestal and second pedestal on the mounting board; mounting an positive optical device, which outputs a light from an active layer, on the first pedestal; and mounting an passive optical device, which includes a silicon waveguide to which the light output from the positive optical device is guided, on the first pedestal Advantageous Effects of Invention According to the present invention, it is possible to provide an optical functional integrated unit and a method for manufacturing thereof in which a positive optical device and a passive optical device including a silicon waveguide can be readily integrated.

DESCRIPTION OF EMBODIMENTS

Figure 1:
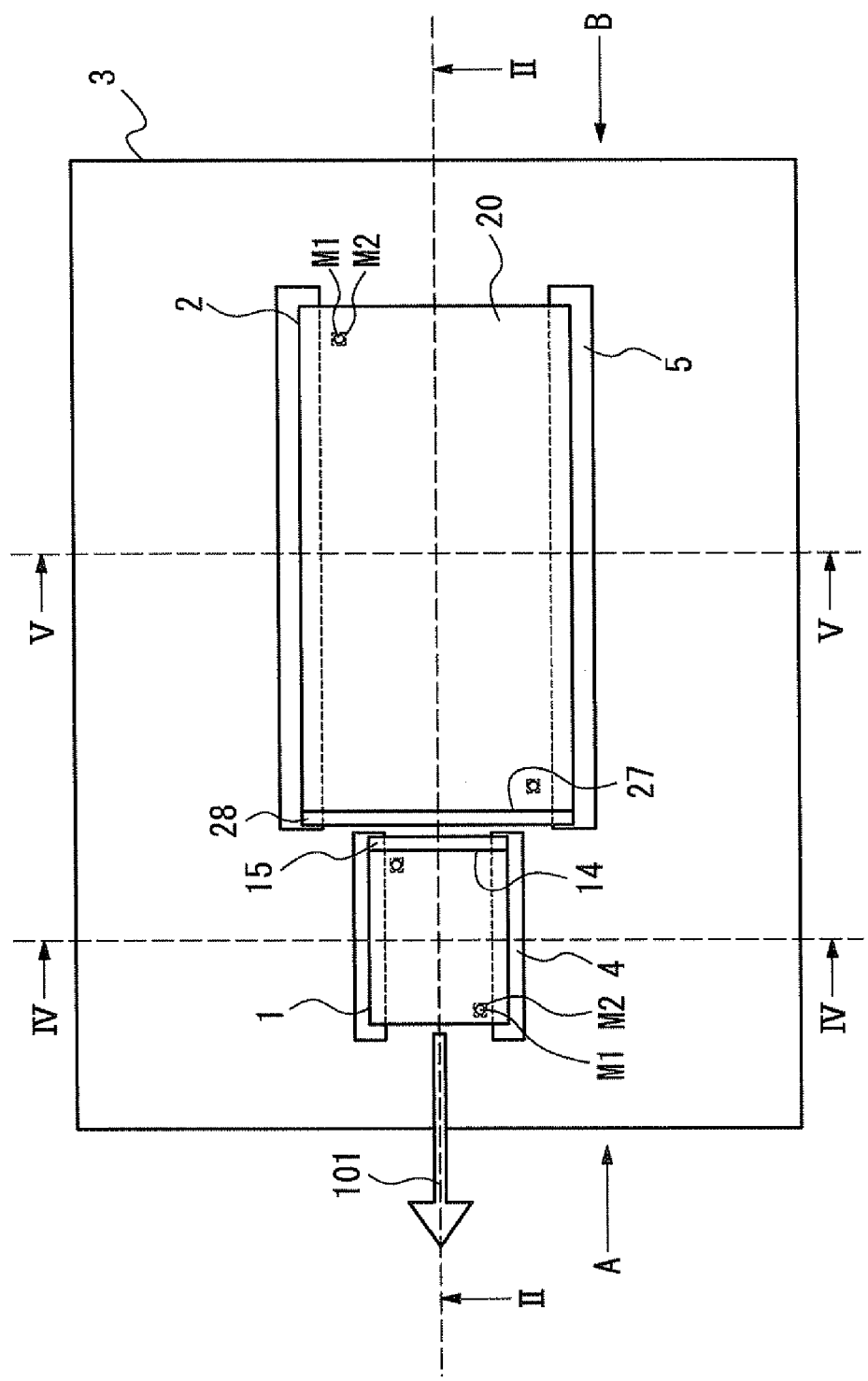
FIG. 1 is a top view schematically showing a configuration an optical functional integrated unit 100 according to a first embodiment.

Exemplary embodiments of the present invention will be described below with reference to the drawings. The same components are denoted by the same reference numerals throughout the drawings, and a repeated explanation is omitted as needed.

First Embodiment

Firstly, an optical functional integrated unit 100 according to a first embodiment shall be described. FIG. 1 is a top view schematically showing a configuration the optical functional integrated unit 100 according to the first embodiment. In this embodiment, an example in which the optical functional integrated unit 100 is configured as a wavelength-tunable laser shall be described. The optical functional integrated unit 100 includes a semiconductor optical amplifier 1, a photonics device 2, a mounting board 3, pedestals 4 and 5. Note that the photonics device 2 is mounted in a manner that an upper surface thereof faces to the mounting board 3. The pedestal 4 and 5 are referred to as first and second pedestals, respectively.

The semiconductor optical amplifier 1 and the photonics device 2 are mounted on the mounting board 3 under a condition that waveguides thereof are aligned with each other. In this case, the semiconductor optical amplifier 1 and the photonics device 2 are mounted with a gap of sub-micron (equal to or less than 1 μm). Note that, for simplifying the drawing, a visible gap is inserted between the semiconductor optical amplifier 1 and the photonics device 2 in FIG. 1. The same shall apply to following drawings.

Figure 2:
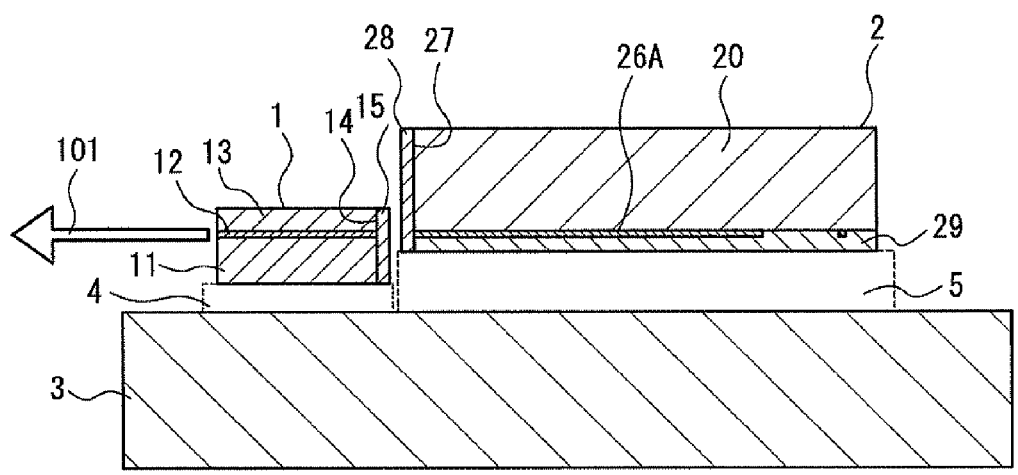
FIG. 2 is a cross-sectional view schematically showing a cross-sectional configuration of the optical functional integrated unit 100 along a II-II line in FIG. 1.

The semiconductor optical amplifier 1 is an example of a positive optical device outputting light, e.g., a semiconductor laser diode. FIG. 2 is a cross-sectional view schematically showing a cross-sectional configuration of the optical functional integrated unit 100 along a II-II line in FIG. 1. The semiconductor optical amplifier 1 includes a semiconductor substrate 11, an active layer 12, a cladding layer 13, and a non-reflective coating 15. The active layer 12 is formed on the semiconductor substrate 11. The active layer 12 is buried by the cladding layer 13. The non-reflective coating 15 is formed on an end at a side of an end face 14 of the active layer 12. The non-reflective coating 15 is formed as a non-reflective coating with respect to air or refractive-index matching gel. The non-reflective coating 15 is referred to as a first non-reflective film. Note that something else such as a contact layer, an electrode and so on is formed on the cladding layer 13, however, the present embodiment will be described with omitting those.

Figure 3:
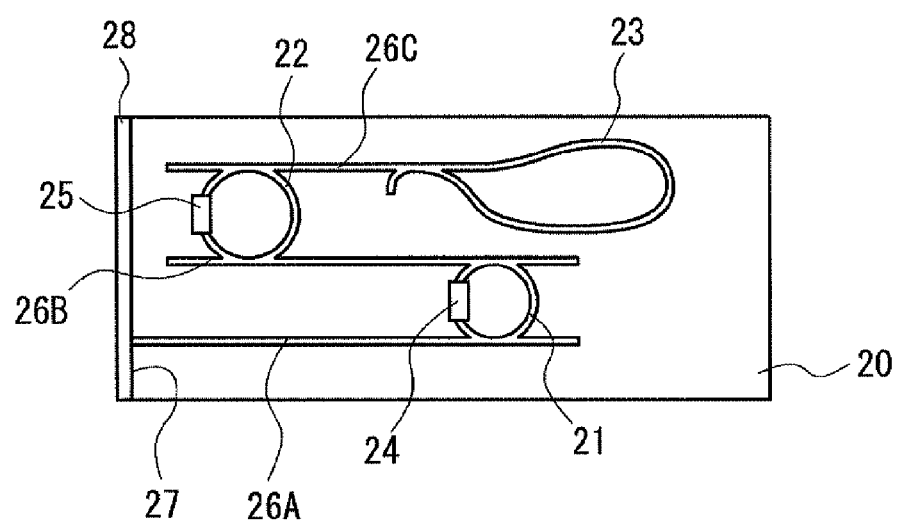
FIG. 3 is a top view schematically showing a configuration of a photonics device 2.

FIG. 3 is a top view schematically showing a configuration of the photonics device 2. That is, FIG. 3 represents the configuration of the photonics device 2 when the photonics device 2 is observed from a side of the mounting board 3. The photonics device 2 is an example of a negative optical device that is configured by using Silicon (Si), and an external resonator including a wavelength-tuning function in the present embodiment. The photonics device 2 can be produced by a Si-process, e.g., a CMOS (Complementary Metal Oxide Semiconductor)-process, etc.

The photonics device 2 includes two ring resonators 21 and 22, a loop mirror 23, electrodes 24 and 25, silicon waveguides 26A to 26C, and a non-reflective coating 28, which are formed on a substrate 20. Note that the ring resonators 21 and 22 are referred to as first and second ring resonators, respectively. The non-reflective coating 28 is referred to as a second non-reflective film. The electrodes 24 and 25 are referred to as first and second electrodes, respectively. The substrate 20 is configured, for example, as a silicon substrate or an SOI (Silicon on Insulator) substrate.

The silicon waveguides 26A to 26C are configured by a narrow line waveguide or a rib waveguide. The silicon waveguide 26A optically connects an end face 27 with the ring resonator 21. The silicon waveguide 26B optically connects the ring resonator 21 with the ring resonator 22. The silicon waveguide 26C optically connects the ring resonator 22 with the loop mirror 23. The non-reflective coating 28 is formed on an end at a side of the end face 27 of the silicon waveguide 26A. The non-reflective coating 28 is formed as a non-reflective coating with respect to air.

The electrode 24 is formed on a part of the ring resonator 21. The electrode 25 is formed on a part of the ring resonator 22. Further, the ring resonator 21 and the ring resonator 22 are slightly different in those diameters.

As shown in FIG. 2, the ring resonators 21 and 22, the loop mirror 23, and the silicon waveguides 26A to 26C are buried by a cladding layer 29. Note that cladding layer 29 is omitted to explain a structure of the photonics device 2 in FIG. 3

Figure 4:
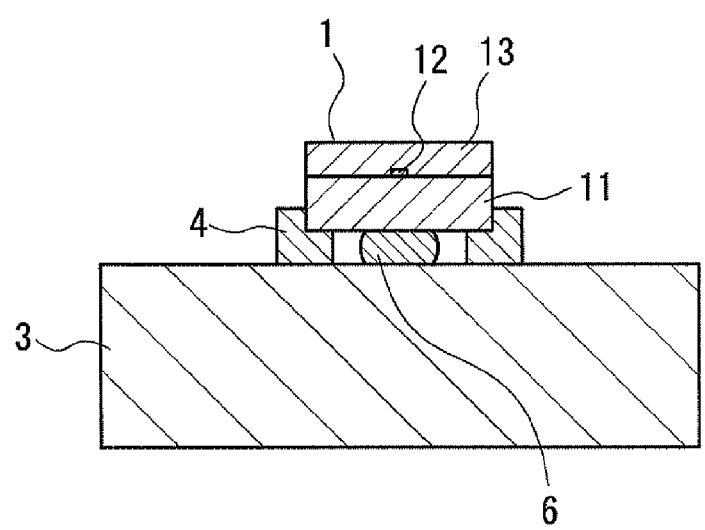
FIG. 4 is a cross-sectional view schematically showing a cross-sectional configuration of the optical functional integrated unit 100 along a IV-IV line in FIG. 1.

As shown in FIGS. 1 and 2, the loop-shaped pedestals 4 and 5 are formed on the mounting board 3. FIG. 4 is a cross-sectional view schematically showing a cross-sectional configuration of the optical functional integrated unit 100 along a IV-IV line in FIG. 1. The semiconductor optical amplifier 1 is fixed on the pedestal 4 by a solder 6. An AuSn solder is used for the solder 6, for example, and the semiconductor optical amplifier 1 and mounting board 3 are bonded each other by reflowing the solder 6 above a certain constant temperature.

Figure 5:
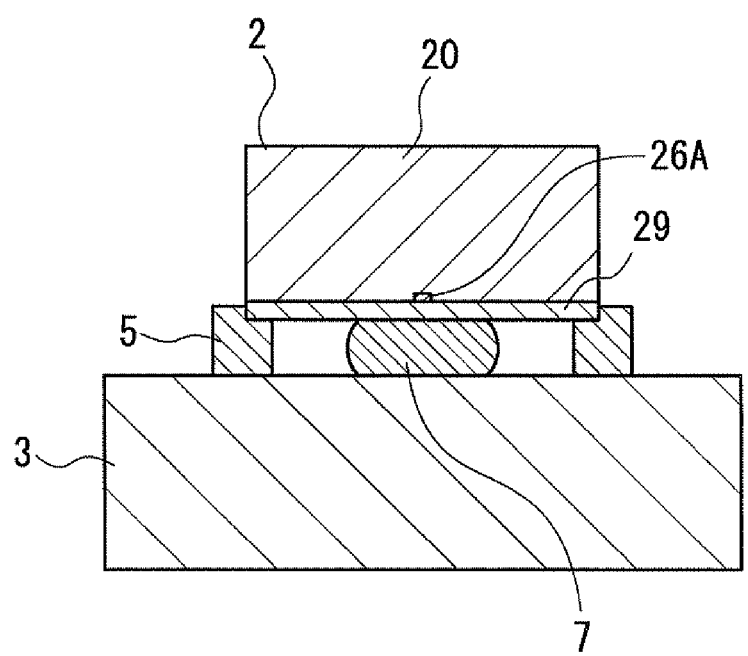
FIG. 5 is a cross-sectional view schematically showing a cross-sectional configuration of the optical functional integrated unit 100 along a V-V line in FIG. 1.

FIG. 5 is a cross-sectional view schematically showing a cross-sectional configuration of the optical functional integrated unit 100 along a V-V line in FIG. 1. The photonics device 2 is fixed on the pedestal 5 by a solder 7 in a manner that a surface on which the ring resonators 21 and 22, the loop mirror 23, the electrodes 24 and 25, and the silicon waveguides 26A to 26C are formed is on the downside. The AuSn solder is used as the solder 7, and the photonics device 2 and mounting board 3 are bonded by reflowing the solder 7 above a certain constant temperature.

Note that heights of the pedestals 4 and 5 are determined to cause a height of the active layer 12 of the semiconductor optical amplifier 1 to coincide with a height of the silicon wave guide 26A of the photonics device 2.

As shown in FIG. 1, a first mark pattern M1 for passive alignment is provided on the semiconductor optical amplifier 1 and the photonics device 2. The first mark pattern and a second mark pattern M2 are recognized using infrared capable of passing through the semiconductor optical amplifier 1 and the photonics device 2, and an optical axis collimating (position alignment) between the active layer 12 of the semiconductor optical amplifier 1 and the silicon waveguide 26A of the photonics device 2 can be precisely performed. Note that the second mark pattern M2 may be provided on the pedestals 4 and 5.

A light output from the side of the end face 14 of the active layer 12 of the semiconductor optical amplifier 1 passes through the non-reflective coating 28 and is incident on the silicon waveguide 26A. The incident light is reflexed by the loop mirror 23 via the ring resonator 21, the silicon waveguide 26B, the ring resonator 22, the silicon waveguide 26C. As described above, the ring resonator 21 and the ring resonator 22 are slightly different in those diameters. There- fore, the wavelength in which a peak of the ring resonator 21 and a peak of the ring resonator 22 harmonize is only one in the wide tunable range. Thus, resonance occurs at the wavelength selected by the ring resonator between the loop mirror 23 and the end face 14 of the semiconductor optical amplifier 1, and the optical functional integrated unit 100 performs laser oscillation. The laser light is output as a laser light 101.

The optical distance of the ring resonator 21 can be changed by applying a voltage to the electrode 24 to change the effective refractive index of the ring resonator 21. The optical distance of the ring resonator 22 can be changed by applying a voltage to the electrode 25 to change the effective refractive index of the ring resonator 22. Therefore, the oscillation wavelength of the optical functional integrated unit 100 can be changed by applying the voltages to the electrodes 24 and 25. That is, the optical functional integrated unit 100 can function as the wavelength-tunable laser.

According to the configuration, the optical functional integrated unit 100 functioning as the wavelength-tunable laser is configured on the mounting board 3. In this configuration, the semiconductor optical amplifier 1 and the photonics device 2 are formed by different manufacturing processes. Then, the semiconductor optical amplifier 1 and the photonics device 2 are concurrently mounted on the mounting board 3. Thus, when the optical functional integrated unit 100 is manufactured, it is not necessary to provide an uneven surface for mounting the semiconductor optical amplifier on the photonics device. As a result, it is possible to form the even and high-quality non-reflective coating 28 on the end face of the photonics device 2.

Further, it is not necessary to provide the uneven surface for mounting the semiconductor optical amplifier on the photonics device, so that a process for forming the uneven surface can be omitted. Thus, the photonics device 2 can be manufactured in a short time and at low cost by the normal COMS process.

As described above, according to the configuration, the optical functional integrated unit 100 in which the positive optical device and the negative optical device are integrated can be manufactured in a shorter time and at lower cost. A wavelength-tunable laser capable of a narrow bandwidth operation, for example, which is necessary for a digital coherent communication method, can be provided by configuring the optical functional integrated unit 100 as the wavelength-tunable laser.

Second Embodiment

Figure 6:
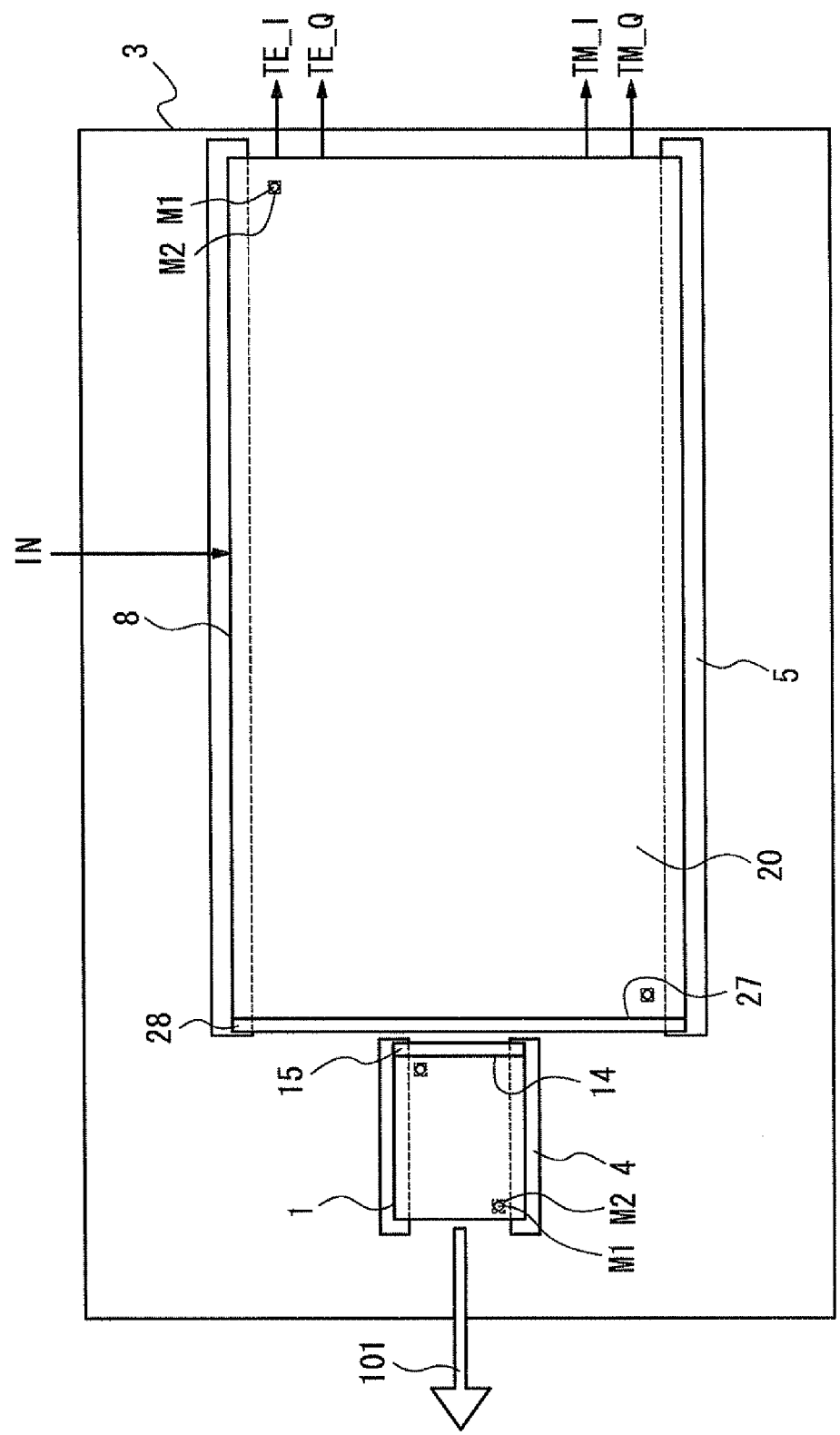
FIG. 6 is a top view schematically showing a configuration of an optical functional integrated unit 200 according to a second embodiment.

Next, an optical functional integrated unit 200 according to a second embodiment shall be described. FIG. 6 is a top view schematically showing a configuration of the optical functional integrated unit 200 according to the second embodiment. The optical functional integrated unit 200 is an alternative of the optical functional integrated unit 100. The optical functional integrated unit 200 has a configuration in which the photonics device 2 in the optical functional integrated unit 100 is replaced with a photonics device 8.

Figure 7:
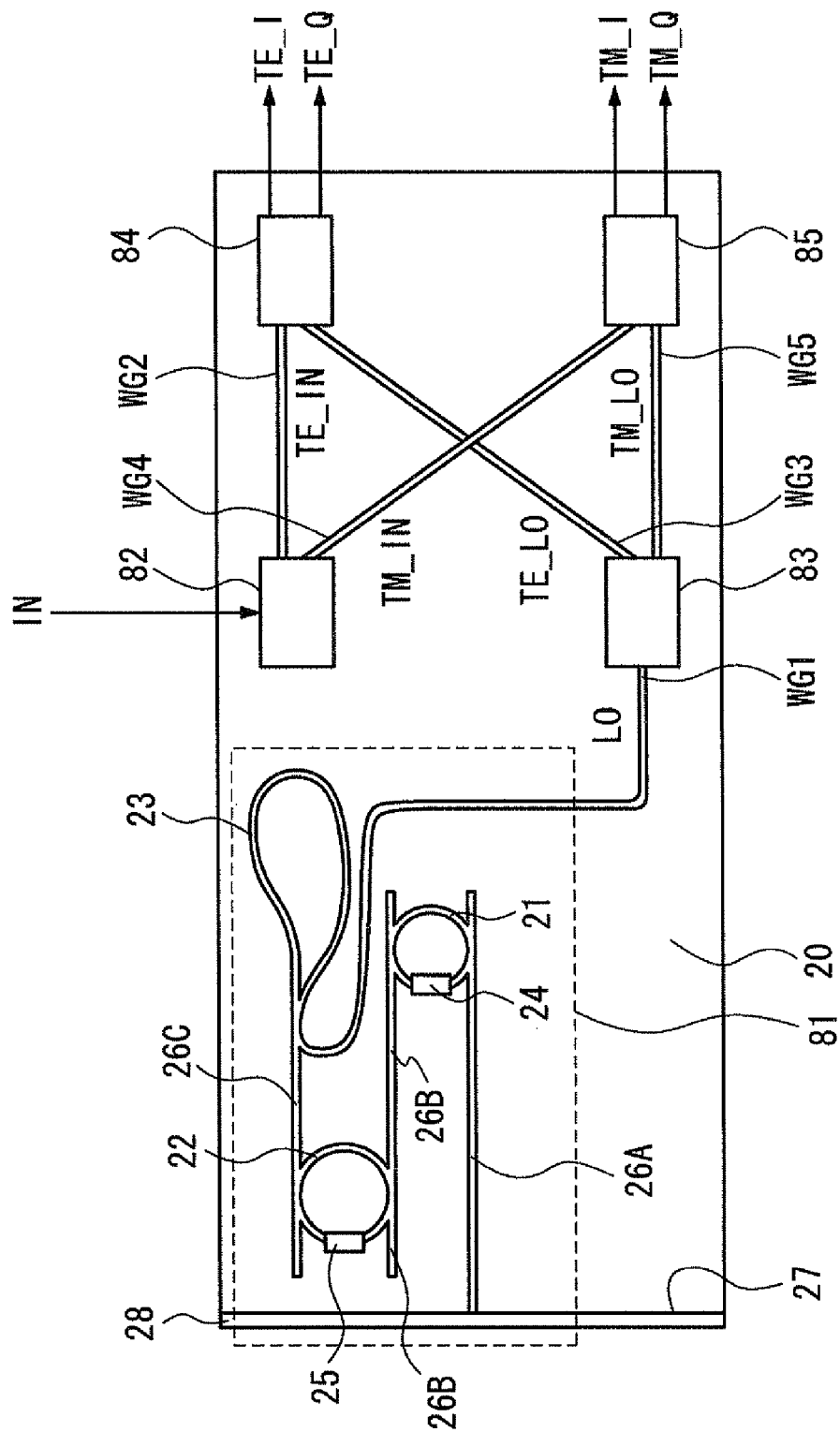
FIG. 7 is a top view schematically showing a configuration of a photonics device 8.

FIG. 7 is a top view schematically showing a configuration of the photonics device 8. That is, FIG. 7 represents the configuration of the photonics device 8 in the case of being observed from a side of the mounting board 3. The photonics device 8 is configured as a receiver (an optical receiver) used in a digital coherent communication. The photonics device 8 includes a wavelength filter 81, polarization-separation units 82 and 83, and 90-degree hybrid interferometers 84 and 85. The polarization-separation units 82 and 83 are referred to as first and second polarization-separation units, respectively. The 90-degree hybrid interferometers 84 and 85 are referred to as first and second interference units.

The wavelength filter 81 includes ring resonators 21 and 22, and a loop mirror 23. The ring resonators 21 and 22, and the loop mirror 23 are the same as those of the optical functional integrated unit 100, thereby descriptions of those are omitted. That is, the semiconductor optical amplifier 1 and the wavelength filter 81 constitute a wavelength-tunable laser that has the same function as the optical functional integrated unit 100.

The polarization-separation unit 82 receives a DP-QPSK (Dual-polarization Quadra phase shift keying) signal light IN from an external optical transmitter. The polarization-separation unit 82 polarizationally separates the received signal light IN into a TE (Transverse Electric) component signal light TE_IN and a TM (Transverse Magnetic) component signal light TM_IN.

The polarization-separation unit 83 receives a laser light from the loop mirror 23 via the waveguide WG1 as a local oscillation light LO. The polarization-separation unit 83 polarizationally separates the local oscillation light LO into a TE component local oscillation light TE_LO and a TM component local oscillation light TM_LO.

The 90-degree hybrid interferometer 84 is a two-input/two-output interferometer. The TE component signal light TE_IN is input to one input of the 90-degree hybrid interferometers 84 via the waveguide WG2. The TE component local oscillation light TE_LO is input to the other input of the 90-degree hybrid interferometers 84 via the waveguide WG3. The 90-degree hybrid interferometer 84 causes the TE component signal light TE_IN and the TE component local oscillation light TE_LO to interfere each other, and outputs an in-phase component TE_I of the TE component signal light TE_IN and a quadrature component TE_Q of the TE component signal light TE_IN from the two outputs, respectively.

The 90-degree hybrid interferometer 85 is a two-input/two-output interferometer. The TM component signal light TM_IN is input to one input of the 90-degree hybrid interferometers 85 via the waveguide WG4. The TM component local oscillation light TM_LO is input to the other input of the 90-degree hybrid interferometers 85 via the waveguide WG5. The 90-degree hybrid interferometer 85 causes the TM component signal light TM_IN and the TM component local oscillation light TM_LO to interfere each other, and outputs an in-phase component TM_I of the TM component signal light TM_IN and a quadrature component TM_Q of the TM component signal light TM_IN from the two outputs, respectively.

Other configurations of the optical functional integrated unit 200 are the same as those of the optical functional integrated unit 100, thereby descriptions of those are omitted.

As described above, according to the configuration, the optical receiver capable of performing polarization-separation and phase-separation on the DP-QPSK signal can be achieved by using the laser light output from the wavelength-tunable laser consisting of the semiconductor optical amplifier 1 and the wavelength filter 81 as the local oscillation light. That is, the optical receiver including the wavelength-tunable laser that is used for the digital coherent communication can be provided as one optical functional integrated unit.

Third Embodiment

Figure 8:
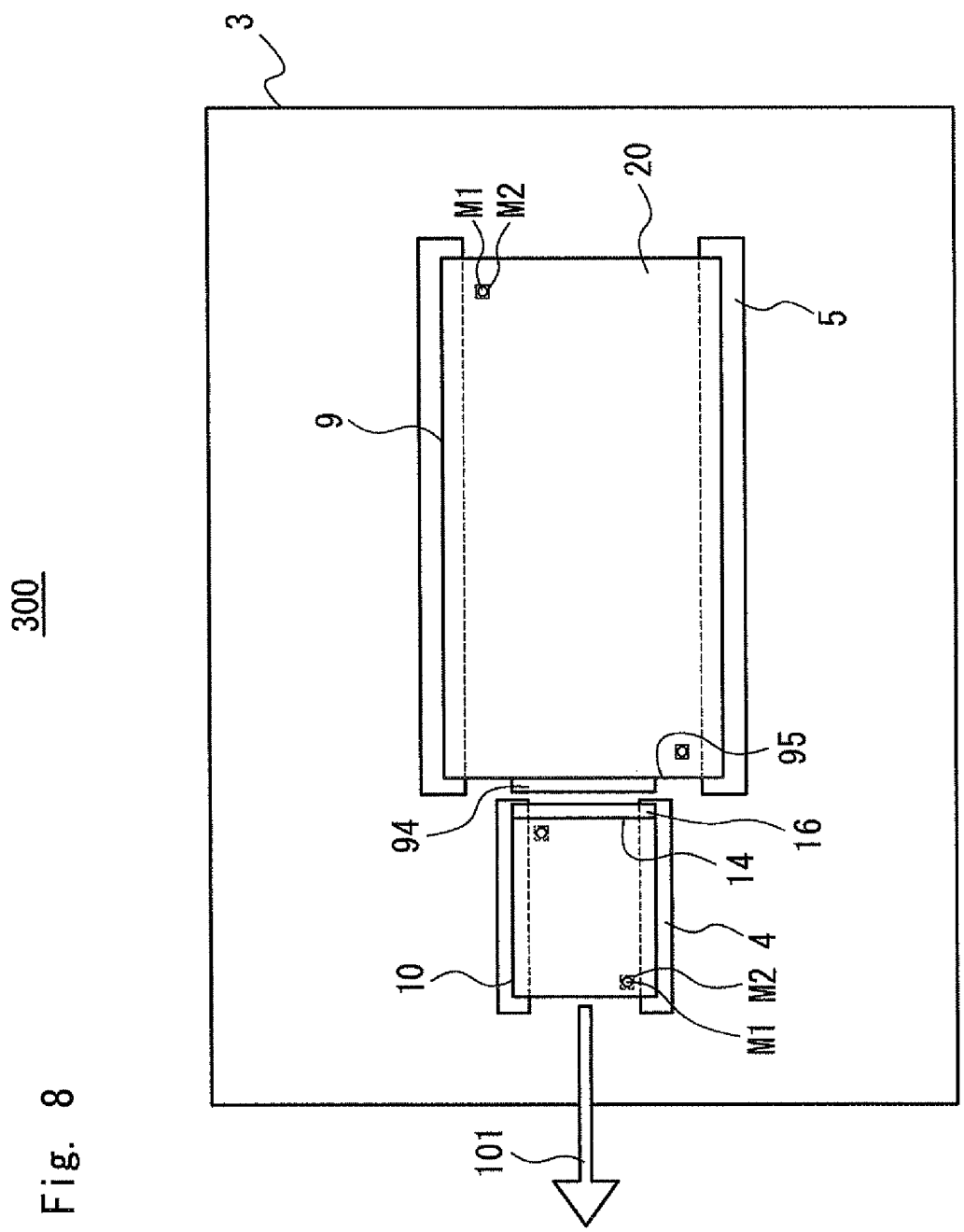
FIG. 8 is a top view schematically showing a configuration of an optical functional integrated unit 300 according to a third embodiment.

Next, an optical functional integrated unit 300 according to a third embodiment shall be described. FIG. 8 is a top view schematically showing a configuration of the optical functional integrated unit 300 according to a third embodiment. The optical functional integrated unit 300 is an alternative of the optical functional integrated unit 100. The optical functional integrated unit 300 has a configuration in which the semiconductor optical amplifier 1 and the photonics device 2 in the optical functional integrated unit 100 are replaced with a semiconductor optical amplifier 10 and a photonics device 9, respectively. The photonics device 9 is configured as an external oscillator as in the case of the photonics device 2.

Figure 9:
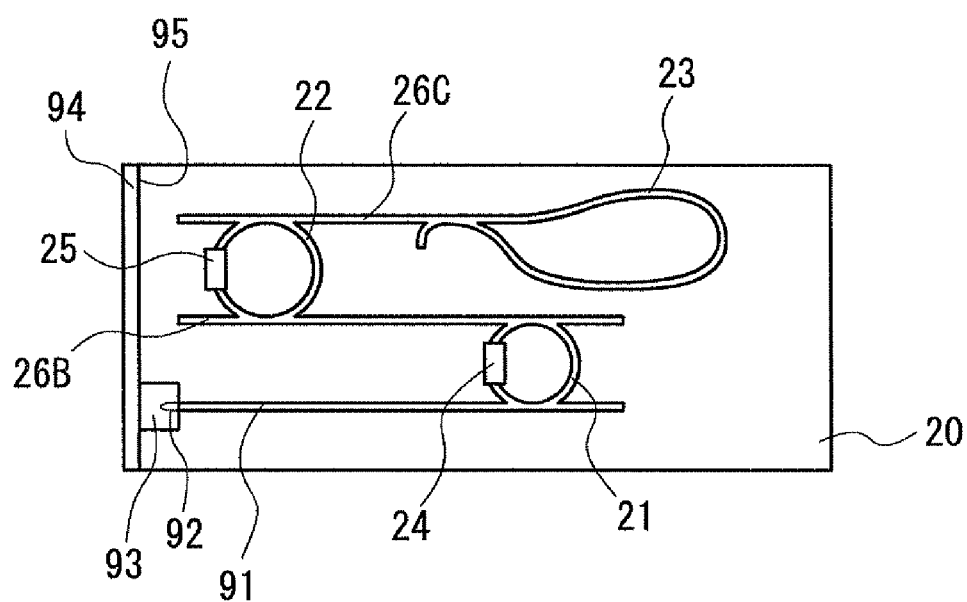
FIG. 9 is a top view schematically showing a configuration of the photonics device 9.

FIG. 9 is a top view schematically showing a configuration of the photonics device 9. In sum, FIG. 9 represents the configuration of the photonics device 9 in the case of being observed from a side of the mounting board 3. The photonics device 9 has a configuration in which the silicon waveguide 26A in the photonics device 2 is replaced with a silicon waveguide 91. Note that, in FIG. 9, the cladding layer 29 is omitted to explain the configuration of the photonics device 9.

Figure 10:
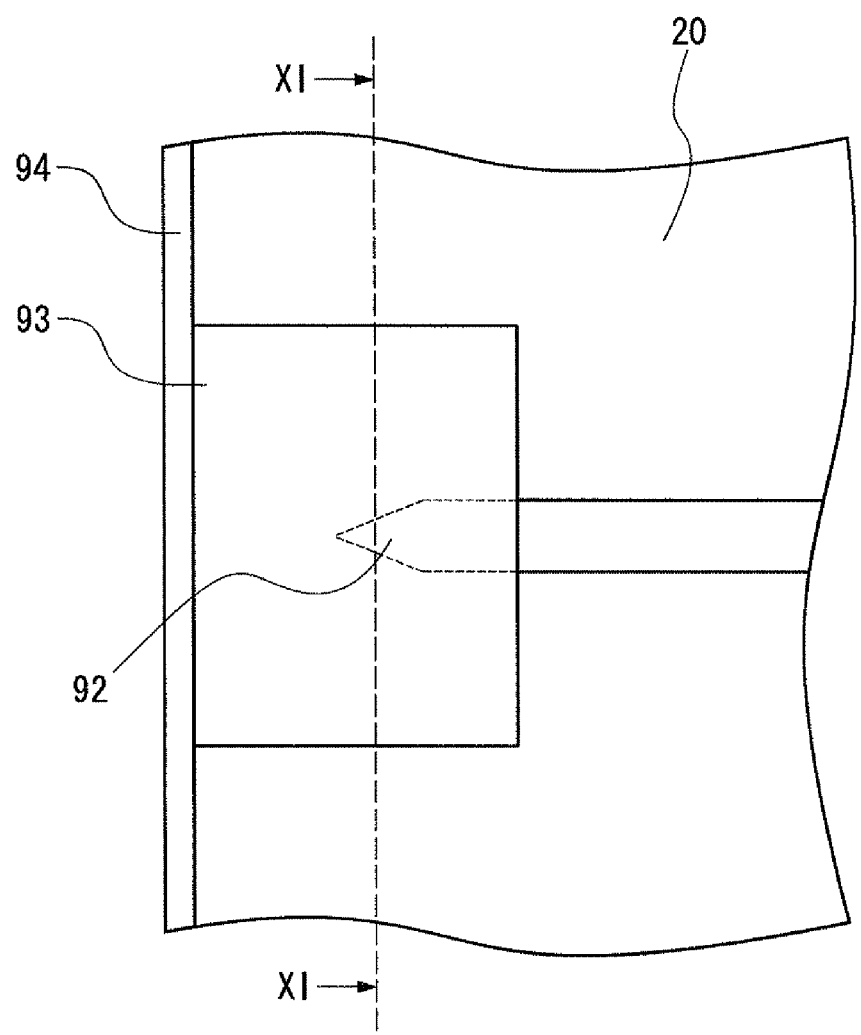
FIG. 10 is an enlarged top view schematically showing the configuration of a photonics device 9 in the vicinity of an end face 95.

FIG. 10 is an enlarged top view schematically showing the configuration of the photonics device 9 in the vicinity of an end face 95. The silicon waveguide 91 has a taper part 92 the tip width in the vicinity of the end face 95 of which becomes gradually narrow. The tip of the taper part 92 of the silicon waveguide 91 is formed at a position that does not reach the end face 95.

Further, the taper part 92 is covered with a connection part 93. The connection part 93 is configured by, for example, Ge (germanium) doped $SiO_2$ (e.g., a refractive index thereof is about 1.5). The connection part 93 is filled between the end face 95 and the taper part 92. A refractive-index matching material 94 (e.g., a refractive index thereof is about 1.5) is applied to the end face 95.

As shown in FIG. 8, the semiconductor optical amplifier 10 has a configuration in which the non-reflective coating 15 in the semiconductor optical amplifier 1 is replaced with a coating 16. The coating 16 is configured by material the refractive index (e.g., a refractive index thereof is about 1.5) of which matches the refractive-index matching material 94 (e.g., the refractive index thereof is about 1.5). Other configurations of the semiconductor optical amplifier 10 are the same as the semiconductor optical amplifier 1, thereby descriptions of those are omitted.

Figure 11:
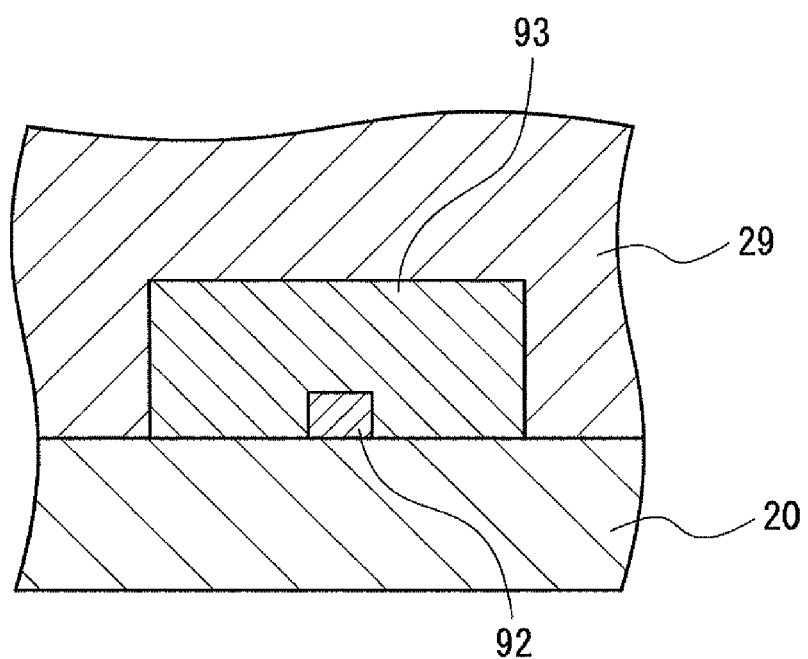
FIG. 11 is an enlarged cross-sectional view schematically showing a cross-sectional configuration in the vicinity of a connection part 93 along a XI-XI line in FIG. 10.

FIG. 11 is an enlarged cross-sectional view schematically showing a cross-sectional configuration in the vicinity of the connection part 93 along a XI-XI line in FIG.10. It is an enlarged cross-sectional view schematically showing a configuration of the photonics device 9 in the vicinity of the end face 95. The silicon waveguide 91 and the connection part 93 are buried by the cladding layer 29 consisting of non-doped $SiO_2$ (e.g., a refractive index thereof is about 1.45). The connection part 93 consists of Ge-doped $SiO_2$, thereby having the higher refractive index than the cladding layer 29. Thus, the connection part 93 can confine the light output from the taper part 92. The light output from the taper part 92 propagates through the connection part 93 in a normal mode and exits the end face 95. Similarly, the light incident on the end face 95 can be incident on the taper part 92 with high efficiency. Other configurations of the optical functional integrated unit 300 are similar to those of the optical functional integrated unit 100, descriptions thereof are thereby omitted.

In the configuration, the end face 95 thorough which the light is incident on the photonics device 9 from the semiconductor optical amplifier 10 and the light is incident on the semiconductor optical amplifier 10 from the photonics device 9 can consist of the Ge-doped $SiO_2$ (e.g., the refractive index thereof is about 1.5). Therefore, the light can readily propagate between the semiconductor optical amplifier 10 and the photonics device 9 without reflection by applying the refractive-index index matching material (e.g., the refractive index thereof is about 1.5) to the end face 95.

Further, in the configuration, a process for forming the non-reflective coating on the photonics device 9 can be omitted. Large-scale vacuum equipment such as a vacuum vapor deposition method is generally used for forming the non-reflective coating. Therefore, the forming of the non-reflective coating requires a long-time and high-cost process. In contrast, in the configuration, the refractive-index matching material 94 is only applied to the end face 95, so that the optical functional integrated unit 300 can be manufactured in shorter time and at lower cost.

Other Embodiments

The present invention is not limited to the above-described exemplary embodiments, and can be modified as appropriate without departing from the scope of the invention. For example, in the first and second embodiments, it is possible to adopt a configuration in which a refractive-index matching material, which matches the refractive-index of the coatings provided on the end face 14 of the semiconductor optical amplifier 1 and the end face 27 of the photonics device 2, is filled between the end face 14 of the semiconductor optical amplifier 1 and the end face 27 of the photonics device 2 in order to couple the semiconductor optical amplifier 1 with the photonics device 2 with further high-efficiency.

In the above-mentioned embodiments, it is explained that the photonics device 2, 8, and 9 are mounted to cause the surface on which the silicon waveguide is formed to face the mounting board. This is because a thickness of the substrate 20 on which the photonics device 2, 8, and 9 are formed is normally about tens of micrometers to hundreds of micrometers, however, a tolerance of the thickness of the substrate 20 is in an order of several micrometers. In the case that there is such tolerance of thickness, when photonics device is mounted to cause the surface of the substrate 20 to face the mounting board, the height of the pedestal has to be adjusted according to the thickness of the substrate 20. Therefore, it is desirable that the photonics device 2, 8, and 9 are mounted in a manner that the surface on which the silicon waveguide is formed faces the mounting board. However, it will be appreciated that the photonics device may be mounted to cause the surface of the substrate 20 to face the mounting board when the tolerance of thickness of the substrate 20 can be suppressed to the extent that the tolerance of thickness can be ignored.

The present invention has been described above with reference to exemplary embodiments, but the present invention is not limited to the above exemplary embodiments. The configuration and details of the present invention can be modified in various manners which can be understood by those skilled in the art within the scope of the invention.

This application is based upon and claims the benefit of priority from Japanese patent application No. 2013-18969, filed on Feb. 1, 2013, the disclosure of which is incorporated herein in its entirety by reference.

REFERENCE SIGNS LIST 1, 10 SEMICONDUCTOR OPTICAL AMPLIFIER
2, 8, 9 PHOTONICS DEVICE
3 MOUNTING BOARD
4, 5 PEDESTAL
6, 7 SOLDER
11 SEMICONDUCTOR SUBSTRATE
12 ACTIVE LAYER
13 CLADDING LAYER
14 END FACE
15 NON-REFLECTIVE COATING
20 SUBSTRATE
21 RING RESONATOR
22 RING RESONATOR
23 LOOP MIRROR
24 ELECTRODE
25 ELECTRODE
26A TO 26C SILICON WAVEGUIDE
27 END FACE
28 NON-REFLECTIVE COATING
29 CLADDING LAYER
81 WAVELENGTH FILTER
82, 83 POLARIZATION SEPARATION UNIT
84, 85 90-DEGREE HYBRID INTERFEROMETERS
91 SILICON WAVEGUIDE
92 TAPER PART
93 CONNECTION PART
94 REFRACTIVE-INDEX MATCHING MATERIAL
95 END FACE
100, 200, 300 OPTICAL FUNCTIONAL INTEGRATED UNIT
IN SIGNAL LIGHT
LO LOCAL OSCILLATION LIGHT
M1, M2 MARK PATTERN
WG1 TO WG5 WAVEGUIDE

The invention claimed is:

1. An optical functional integrated unit comprising:
a mounting board;
a first pedestal and a second pedestal that are provided on the mounting board;
a positive optical device that is a semiconductor optical amplifier mounted on the first pedestal and configured to output a light from an active layer; and
a passive optical device that is an external oscillator mounted on the second pedestal,
wherein the passive optical device comprises:
a silicon waveguide through which the light output from the positive optical device is guided;
a substrate;
a first ring resonator that is formed on the substrate and optically connected to the silicon waveguide, the first ring resonator being configured by silicon;
a second ring resonator that is formed on the substrate and optically connected to the silicon waveguide, the second ring resonator having a different diameter from the first ring resonator, the second ring resonator being configured by silicon;
a mirror that is formed at an end opposite to an end at a side of the positive optical device;
a first electrode that is formed on the first ring resonator;
a second electrode that is formed on the second ring resonator;
a first polarization-separation unit that separates a polarization-multiplexed and phase-modulated optical signal input from outside into a first TE component and a first TM component;
a second polarization-separation unit that separates a laser light exiting from the mirror into a second TE component and a second TM component;
a first interferometer that causes the first TE component to interfere with the second TE component to output two optical signals, the phases of the two optical signals being different by 90 degrees; and a second interferometer that causes the first TM component to interfere with the second TM component to output two optical signals, the phases of the two optical signals being different by 90 degrees.

2. The optical functional integrated unit according to claim 1, wherein the positive optical device comprises a first non-reflective film formed on an end at a side of the passive optical device of the active layer.

3. The optical functional integrated unit according to claim 2, wherein the passive optical device further comprises a second non-reflective film formed on the end at the side of the positive optical device of the silicon waveguide.

4. The optical functional integrated unit according to claim 3, wherein a refractive-index matching material is filled between the positive optical device and the passive optical device.

5. The optical functional integrated unit according to claim 1, wherein heights of the first pedestal and the second pedestal are determined to bring a position of the active layer from a surface of the mounting board into line with a position of the silicon waveguide from the surface of the mounting board.

6. The optical functional integrated unit according to claim 1, further comprising:
a first mark pattern that is formed on the positive optical device and the passive optical device;
a second mark pattern that is formed on the first pedestal and second pedestal, or the mounting board,
wherein the first mark pattern and second mark pattern are configured to be able to perform position alignment using a light that has a wavelength capable of passing through the positive optical device and the passive optical device.

7. A method for manufacturing an optical functional integrated unit comprising:
forming a first pedestal and second pedestal on a mounting board;
mounting an positive optical device on the first pedestal, the positive optical device being a semiconductor optical amplifier configured to output a light from an active layer; and
mounting an passive optical device on the second pedestal,
wherein the passive optical device is an external oscillator comprising:
a silicon waveguide to which the light output from the positive optical device is guided;
a substrate;
a first ring resonator that is formed on the substrate and optically connected to the silicon waveguide, the first ring resonator being configured by silicon;
a second ring resonator that is formed on the substrate and optically connected to the silicon waveguide, the second ring resonator having a different diameter from the first ring resonator, the second ring resonator being configured by silicon;
a mirror that is formed at an end opposite to an end at a side of the positive optical device;
a first electrode that is formed on the first ring resonator;
a second electrode that is formed on the second ring resonator;
a first polarization-separation unit that separates a polarization-multiplexed and phase-modulated optical signal input from outside into a first TE component and a first TM component;
a second polarization-separation unit that separates a laser light exiting from the mirror into a second TE component and a second TM component;
a first interferometer that causes the first TE component to interfere with the second TE component to output two optical signals, the phases of the two optical signals being different by 90 degrees; and
a second interferometer that causes the first TM component to interfere with the second TM component to output two optical signals, the phases of the two optical signals being different by 90 degrees.

8. An optical functional integrated unit comprising:
a mounting board;
a first pedestal and a second pedestal that are provided on the mounting board;
a positive optical device that is mounted on the first pedestal and outputs a light from an active layer; and
a passive optical device that is mounted on the second pedestal,
wherein the passive optical device comprises:
a silicon waveguide through which the light output from the positive optical device is guided;
a first polarization-separation unit that separates a polarization-multiplexed and phase-modulated optical signal input from outside into a first TE component and a first TM component;
a second polarization-separation unit that separates a laser light into a second TE component and a second TM component;
a first interferometer that causes the first TE component to interfere with the second TE component to output two optical signals, the phases of the two optical signals being different by 90 degrees; and
a second interferometer that causes the first TM component to interfere with the second TM component to output two optical signals, the phases of the two optical signals being different by 90 degrees.

9. The optical functional integrated unit according to claim 8, wherein the positive optical device is a semiconductor optical amplifier.

10. The optical functional integrated unit according to claim 9, wherein
the passive optical device is an external oscillator, and
the semiconductor optical amplifier and the external oscillator constitute a wavelength-tunable laser.

11. The optical functional integrated unit according to claim 10, wherein the passive optical device further comprises:
a substrate;
a first ring resonator that is formed on the substrate and optically connected to the silicon waveguide, the first ring resonator being configured by silicon;
a second ring resonator that is formed on the substrate and optically connected to the silicon waveguide, the second ring resonator having a different diameter from the first ring resonator, the second ring resonator being configured by silicon;
a mirror that is formed at an end opposite to an end at a side of the positive optical device;
a first electrode that is formed on the first ring resonator; and
a second electrode that is formed on the second ring resonator.

12. The optical functional integrated unit according to claim 8, wherein the positive optical device comprises a first non-reflective film formed on an end at a side of the passive optical device of the active layer.

13. The optical functional integrated unit according to claim 12, wherein the passive optical device further comprises a second non-reflective film formed on an end at a side of the positive optical device of the silicon waveguide.

14. The optical functional integrated unit according to claim 13, wherein a refractive-index matching material is filled between the positive optical device and the passive optical device.

15. The optical functional integrated unit according to claim 8, wherein heights of the first pedestal and the second pedestal are determined to bring a position of the active layer from a surface of the mounting board into line with a position of the silicon waveguide from the surface of the mounting board.

16. The optical functional integrated unit according to claim 8, further comprising:
- a first mark pattern that is formed on the positive optical device and the passive optical device;
- a second mark pattern that is formed on the first pedestal and second pedestal, or the mounting board,
- wherein the first mark pattern and second mark pattern are configured to be able to perform position alignment using a light that has a wavelength capable of passing through the positive optical device and the passive optical device.

* * * * *

UNITED STATES PATENT AND TRADEMARK OFFICE
CERTIFICATE OF CORRECTION

Page 1 of 1

PATENT NO. : 9,577,410 B2
APPLICATION NO. : 14/764607
DATED : February 21, 2017
INVENTOR(S) : Hiroyuki Yamazaki It is certified that error appears in the above-identified patent and that said Letters Patent is hereby corrected as shown below:

On the Title Page

Item (57), Lines 6-7, "pedestals and. The pedestals and are provided on the mounting board." should read -- and pedestals. The pedestals are provided on the mounting board. --.

Item (57), Line 11, "includes silicon waveguide" should read -- includes a silicon waveguide --.

Signed and Sealed this
Fourth Day of July, 2017

Joseph Matal
*Performing the Functions and Duties of the*
*Under Secretary of Commerce for Intellectual Property and*
*Director of the United States Patent and Trademark Office*